(12) United States Patent
Harada et al.

(10) Patent No.: US 12,152,300 B2
(45) Date of Patent: Nov. 26, 2024

(54) CHEMICAL VAPOR DEPOSITION METHOD USING AN ORGANOMANGANESE COMPOUND AS A STARTING MATERIAL

(71) Applicant: TANAKA KIKINZOKU KOGYO K.K., Tokyo (JP)

(72) Inventors: Ryosuke Harada, Tsukuba (JP); Tomohiro Tsugawa, Tsukuba (JP); Toshiyuki Shigetomi, Tsukuba (JP); Seung-Joon Lee, Tsukuba (JP); Ketan Baban Katkar, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 280 days.

(21) Appl. No.: 17/615,272

(22) PCT Filed: Jun. 15, 2020

(86) PCT No.: PCT/JP2020/023378
§ 371 (c)(1),
(2) Date: Nov. 30, 2021

(87) PCT Pub. No.: WO2020/255913
PCT Pub. Date: Dec. 24, 2020

(65) Prior Publication Data
US 2022/0235455 A1 Jul. 28, 2022

(30) Foreign Application Priority Data
Jun. 17, 2019 (JP) .................................. 2019-111737

(51) Int. Cl.
 *C23C 16/06* (2006.01)
 *C07F 13/00* (2006.01)
 *C23C 16/18* (2006.01)
(52) U.S. Cl.
 CPC .............. *C23C 16/18* (2013.01); *C07F 13/00* (2013.01)
(58) Field of Classification Search
 CPC .................................. C23C 16/06; C23C 16/18
 See application file for complete search history.

(56) References Cited

U.S. PATENT DOCUMENTS

| | | | |
|---|---|---|---|
| 9,328,415 B2 * | 5/2016 | Thompson | H01L 21/28562 |
| 9,349,687 B1 * | 5/2016 | Gates | H01L 21/76834 |
| 10,787,738 B2 | 9/2020 | Abels et al. | |
| 2010/0151396 A1 * | 6/2010 | Papachristos | C10L 1/1857 44/361 |
| 2010/0178481 A1 * | 7/2010 | George | C23C 16/402 428/332 |
| 2011/0163062 A1 * | 7/2011 | Gordon | H01L 21/76832 216/13 |
| 2012/0114869 A1 * | 5/2012 | Miyoshi | H01L 23/53238 427/515 |
| 2013/0089679 A1 * | 4/2013 | Dussarrat | C23C 16/45536 427/576 |
| 2014/0183742 A1 * | 7/2014 | Matsumoto | H01L 21/76867 438/653 |
| 2014/0183743 A1 * | 7/2014 | Matsumoto | H01L 21/76814 438/653 |
| 2015/0004314 A1 | 1/2015 | Winter et al. | |
| 2015/0004315 A1 | 1/2015 | Winter et al. | |
| 2015/0110975 A1 * | 4/2015 | Matsumoto | C23C 16/42 427/586 |
| 2015/0325474 A1 | 11/2015 | Gordon et al. | |
| 2016/0185807 A1 * | 6/2016 | Kanjolia | C07F 17/00 427/255.28 |
| 2016/0194755 A1 * | 7/2016 | Wiese | C23C 16/06 427/255.394 |
| 2016/0289250 A1 | 10/2016 | Winter et al. | |
| 2016/0326646 A1 * | 11/2016 | Matsumoto | C23C 16/45529 |
| 2017/0012001 A1 | 1/2017 | Gordon et al. | |
| 2017/0330797 A1 * | 11/2017 | Lai | C23C 16/45525 |
| 2019/0151396 A1 * | 5/2019 | Bombardelli | A61K 31/194 |

FOREIGN PATENT DOCUMENTS

| | | |
|---|---|---|
| JP | 2013-508979 A | 3/2013 |
| JP | 2019-031508 A | 2/2019 |
| KR | 10-2018-0111865 A | 10/2018 |
| WO | WO-2013/191065 A1 | 12/2013 |

OTHER PUBLICATIONS

Cahiez, Gerard, et al., "Chemistry of Organomanganese(II) Compounds". Chem. Rev. 2009, 109, 1434-1476.*
McClymont, Kyle S., et al., "Organomanganese Chemistry". Baran Group Meeting May 27, 2016, pp. 1-10.*
Oshima, Koichiro, "Use of organomanganese reagents in organic synthesis". Journal of Organometallic Chemistry 575 (1999) 1-20.*
Treichel, P.M., et al., "Synthesis and electrochemistry of C5H5Mn(CNR)3 compounds". Inorganic Chimica Acta, vol. 22, 1977, 1 page. Abstract Only.*
Humphrey, Brian D., et al., "The synthesis and cyclic voltammetry of select ferrocene piano-stool isocyanide complexes". Inorganica Chimica Acta, 368 (2011) pp. 271-274.*
Manning, A.R., et al., "The reactions of sulfuryl chloride with [Fe2(η-C5H5)2(CO)4-n(CNMe)n] (n=0, 1, 2 and 4) and related complexes. The crystal structure of [Fe(η5-C9H7)(CO)3] [FeCl4]". Journal of Organometallic Chemistry, vol. 338, Issue 3, Jan. 19, 1988, pp. 383-392.*
Sun, Huaxing, et al., "Chemical Vapor Deposition of Manganese Metallic Films on Silicon Oxide Substrates". The Journal of Physical Chemistry C, 2012, 116, 23585-23595.*

(Continued)

*Primary Examiner* — Bret P Chen
(74) *Attorney, Agent, or Firm* — Foley & Lardner LLP

(57) ABSTRACT

A raw material for chemical deposition for producing a manganese thin film or a manganese compound thin film by chemical deposition method, including an organomanganese compound represented Chemical Formula 1 in which a cyclopentadienyl ligand and an isocyanide ligand are coordinated to manganese, which has basic characteristics as a raw material for chemical deposition and enables formation of a manganese thin film with a reducing gas such as hydrogen used as a reaction gas.

5 Claims, 3 Drawing Sheets

(56) References Cited

OTHER PUBLICATIONS

Au, Yeung, et al., "Selective Chemical Vapor Deposition of Manganese Self-Aligned Capping Layer for Cu Interconnections in Microelectronics". Journal of The Electrochemical Society, 157 (6) D341-D345 (2010).*

Office Action issued in corresponding Korean Patent Application No. 10-2021-7037552 dated Sep. 19, 2023 (10 pages).

Nakamura et al., "Spectroscopic Study on Metallorganic Chemical Vapor Deposition of Manganese Oxide Films," Journal of the Electrochemical Society, vol. 152, No. 9, 2005, pp. C584-C587.

Yan et al., "Synthesis, characterization, and kinetic study of $Mn(DPM)_3$ used as precursor for MOCVD," Ionics, vol. 15, 2009, pp. 627-633.

Sun et al., "Chemical Vapor Deposition of Manganese Metallic Films on Silicon Oxide Substrates," The Journal of Physical Chemistry C, vol. 116, 2012, pp. 23585-23595.

International Searching Authority, "International Search Report," issued in connection with International Patent Application No. PCT/JP2020/023378, dated Sep. 1, 2020.

International Searching Authority, "Written Opinion," issued in connection with International Patent Application No. PCT/JP2020/023378, dated Sep. 1, 2020.

Office Action issued in corresponding Chinese Patent Application No. 202080042968.4 dated Dec. 28, 2023 (10 pages).

Office Action issued in corresponding Japanese Patent Application No. 2021-528211 dated Jan. 29, 2024 (3 pages).

\* cited by examiner

CHEMICAL VAPOR DEPOSITION METHOD USING AN ORGANOMANGANESE COMPOUND AS A STARTING MATERIAL

CROSS-REFERENCE TO RELATED APPLICATIONS

The present application claims priority under 37 U.S.C. § 371 to International Patent Application No. PCT/JP2020/023378, filed Jun. 15, 2020, which claims priority to and the benefit of Japanese Patent Application No. 2019-111737, filed on Jun. 17, 2019. The contents of these applications are hereby incorporated by reference in their entireties.

TECHNICAL FIELD

The present invention relates to a raw material for chemical deposition including an organomanganese compound for producing a manganese thin film or a manganese compound thin film by a chemical deposition method. Specifically, the present invention relates to a raw material for chemical deposition including an organomanganese compound that contains no oxygen atom in the structure and enables formation of a manganese film with a reducing gas such as hydrogen.

BACKGROUND ART

In production process of various semiconductor devices in which copper wirings are applied, a barrier layer is formed in an underlying portion of a copper wiring layer in many cases for inhibiting electromigration. As the barrier layer, a Ta film, a TaN film or the like have been applied, while in recent years, application of a Mn film or a CuMn alloy film to a barrier layer is under examination for improving reliability. With respect to a film formation method for a Mn film of recent years, cases of application of not sputtering but chemical deposition methods such as a CVD method (chemical vapor deposition method) and an ALD method (atomic layer deposition method) are increasing. This is because a chemical deposition method excellent in step coverage is advantageous for coping with further miniaturization in linewidth and hole diameter due to size reduction and integration increase of semiconductor devices of recent years.

As raw materials (precursors) for forming a manganese thin film or a manganese-containing thin film by a chemical deposition method, some organomanganese compounds are conventionally known. As an organomanganese compound used as a raw material for chemical deposition, for example, tris(2,2,6,6-tetramethyl-3,5-heptadionate)manganese represented by Chemical Formula 1 in which three β-diketonato ligands, 2,2,6,6-tetramethyl-3,5-heptadionate, are coordinated to manganese is known (Non Patent Document 1 and Non Patent Document 2). Besides, ($\eta^5$-1-methyl-cyclopentadienyl)tricarbonyl manganese represented by Chemical Formula 2 in which a cyclopentadienyl ligand and carbonyl are coordinated to manganese is regarded as useful as an organomanganese compound used as a raw material for chemical deposition (Non Patent Document 3).

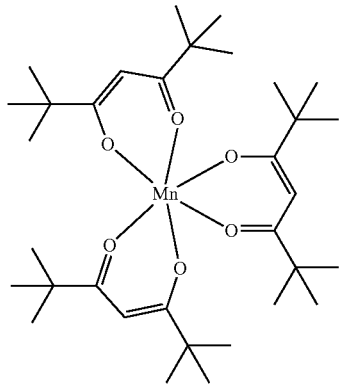

[Chemical Formula 1]

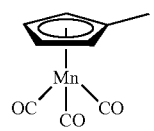

[Chemical Formula 2]

CITATION LIST

Non Patent Document

Non Patent Document 1: Ruiqiang Yan, Weiya Huang, Qingfeng Wang, Yinzhu Jiang, Ionics. 2009, 15, 627-633

Non Patent Document 2: Toshihiro Nakamura, Ryusuke Tai, Takuro Nishimura, Kunihide Tachibana, J. Electrochem. Soc. 2005, 152, C584-0587

Non Patent Document 3: Huaxing Sun, Francisco Zaera, J. Phys. Chem. C 2012, 116, 23585-23595

SUMMARY OF INVENTION

Technical Problem

Conventional raw materials for chemical deposition such as the above-described organomanganese compounds satisfy a basic characteristic whether or not a manganese thin film can be formed. In anticipation of further densification of semiconductor devices, however, an organomanganese compound used as a raw material for chemical deposition is now required to exhibit various characteristics. For example, in many of conventional raw materials for chemical deposition including an organomanganese compound, oxygen is applied as a reaction gas, which causes a problem of substrate oxidation corresponding to an underlying portion. Therefore, an organomanganese compound enabling film formation with a reducing gas such as hydrogen used as a reaction gas is demanded.

In addition, requirements in the purity and the quality of a manganese thin film have become high, and also from this point of view, improvement of a raw material for chemical deposition is examined. In this point, many of organomanganese compounds composing conventional raw materials for chemical deposition contain an oxygen atom in the structure. The organomanganese compounds represented by Chemical Formulas 1 and 2 described above contain an oxygen atom in the structure. Such an organomanganese compound containing an oxygen atom may generate a manganese oxide during film formation in some cases. For forming a high-purity manganese thin film, not only the above-described problem of a reaction gas needs to be solved but also improvement from the viewpoint of a constituent element needs to be made.

In the case where a novel organomanganese compound is to be found, it should have characteristics originally required in a raw material for chemical deposition. A chemical deposition method is a method in which a raw material compound is vaporized to obtain a raw material gas, and the raw material gas is transported onto a substrate and decomposed on the substrate to form a thin film. In this film formation process, it is necessary to rapidly vaporize the raw material compound, and hence a compound having an appropriately high vapor pressure is suitably used. Besides, a compound that has appropriate thermal stability and is excellent in handleability so as not to be easily decomposed except on the surface of the substrate is preferred. These basic characteristics should be satisfied.

In this manner, organomanganese compounds conventionally applicable as a raw material for chemical deposition cannot cope with all of diversifying characteristic requirements. Therefore, the present invention provides a raw material for chemical deposition including an organomanganese compound that possesses basic characteristics as a raw material for chemical deposition and enables formation of a high-quality manganese thin film with a reducing gas such as hydrogen used as a reaction gas.

Solution to Problem

The present invention solving the above-described problem is drawn to a raw material for chemical deposition for producing a manganese thin film or a manganese compound thin film by a chemical deposition method, including an organomanganese compound represented by the following Chemical Formula 3 in which a cyclopentadienyl ligand (L1) and an isocyanide ligand (L2) are coordinated to manganese:

[Chemical Formula 3]

Mn(L1)(L2)$_3$

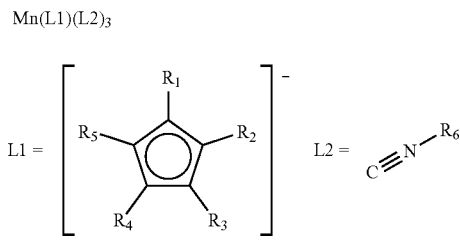

wherein substituents $R_1$ to $R_5$ of the cyclopentadienyl ligand (L1) each are hydrogen, or a linear, branched or cyclic alkyl group having a carbon number of 1 or more and 4 or less, and a substituent $R_6$ of the isocyanide ligand (L2) is a linear, branched or cyclic alkyl group having a carbon number of 1 or more and 4 or less.

The organomanganese compound constituting the raw material for chemical deposition of the present invention is characterized in that an isocyanide ligand and a cyclopentadienyl ligand are applied as ligands.

As is understood from the above-described formula, the isocyanide ligand is a ligand containing carbon, hydrogen and nitrogen. The cyclopentadienyl ligand is a ligand containing carbon and hydrogen. Neither of the ligands contains an oxygen atom. In the present invention, no ligand is coordinated to manganese other than the isocyanide ligand and the cyclopentadienyl ligand. Accordingly, the organomanganese compound of the present invention does not contain an oxygen atom in the structure. Therefore, the organomanganese compound of the present invention enables film formation of a pure manganese thin film without generating an oxide (manganese oxide). Besides, in the organomanganese compound of the present invention, ligands having a comparatively smaller number of carbon atoms (the isocyanide ligand and the cyclopentadienyl ligand) are applied, and in addition, the number of carbon atoms of the substituents of the ligands are also limited. Also from this point of view, the organomanganese compound of the present invention enables film formation of a high-quality manganese thin film.

According to the present inventors, the organomanganese compound of the present invention in which the isocyanide ligand is applied has appropriate thermal stability, and is more reactive to hydrogen than a conventional compound. Therefore, hydrogen can be applied as a reaction gas, and a manganese thin film can be formed under a reducing atmosphere. The organomanganese compound of the present invention can highly inhibit oxidation of a substrate and a manganese thin film owing to a structural advantage of the compound not containing an oxygen atom as described above and a reactivity advantage under a reducing atmosphere.

The structure of the organomanganese compound used as a raw material for chemical deposition of the present invention having the above-described advantages will now be described in detail.

In the organomanganese compound of the present invention, the cyclopentadienyl ligand (L1) is coordinated as a ligand, as well as the isocyanide ligand. The cyclopentadienyl ligand is a well-known ligand also in conventional organomanganese compounds, and form a stable bond with manganese. Further, this ligand contributes to optimize the thermal stability of the compound cooperatively with the isocyanide ligand.

The substituents $R_1$ to $R_5$ of the cyclopentadienyl ligand (L1) each are hydrogen, or a linear, branched or cyclic alkyl group having a carbon number of 1 or more and 4 or less. The numbers of carbon atoms of the substituents are limited for optimizing a vaporization characteristic of the organomanganese compound. Examples of an alkyl group having a carbon number of 1 or more and 4 or less include a methyl group, an ethyl group, a n-propyl group, an iso-propyl group, a n-butyl group, a sec-butyl group, and a tert-butyl group. The substituents $R_1$ to $R_5$ may be all the same substituent, or different substituents. In a particularly preferable aspect of the cyclopentadienyl ligand of the present invention, $R_1$ to $R_5$ are all hydrogen in the cyclopentadienyl ligand, or $R_1$ is a methyl group or an ethyl group and $R_2$ to $R_5$ are all hydrogen in the cyclopentadienyl ligand.

The organomanganese compound of the present invention is characterized in that the isocyanide ligand (L2) is applied as a ligand to manganese. In the present invention, the isocyanide ligand makes a contribution to reactivity improvement and optimization of thermal stability of the compound.

In the organomanganese compound of the present invention, the substituent $R_6$ of the isocyanide ligand is a linear, branched or cyclic alkyl group having a carbon number of 1 or more and 4 or less. The substituent is limited to an alkyl group for obtaining an appropriate molecular weight with the structure of the ligand coordinated to manganese limited to carbon, hydrogen and nitrogen. Besides, the number of carbon atoms is limited for obtaining an appropriate molecular weight of the compound and optimizing the vaporization characteristic and decomposition characteristic. A substituent having an excessively large number of carbon atoms increases the molecular weight, which may affect the vaporization characteristic of the organomanganese compound.

In a specific preferable aspect of the substituent $R_6$ of the isocyanide ligand (L2), $R_6$ is any one of a methyl group, an ethyl group, a n-propyl group, an iso-propyl group, a sec-butyl group, a n-butyl group and a tert-butyl group (2-methylpropyl group).

Preferable specific examples of a structural formula of the organomanganese compound constituting the raw material for chemical deposition of the present invention described above include the following:

[Chemical Formula 4]

Compounds having substituents $R_1$ to $R_5$ in L1 being all hydrogen

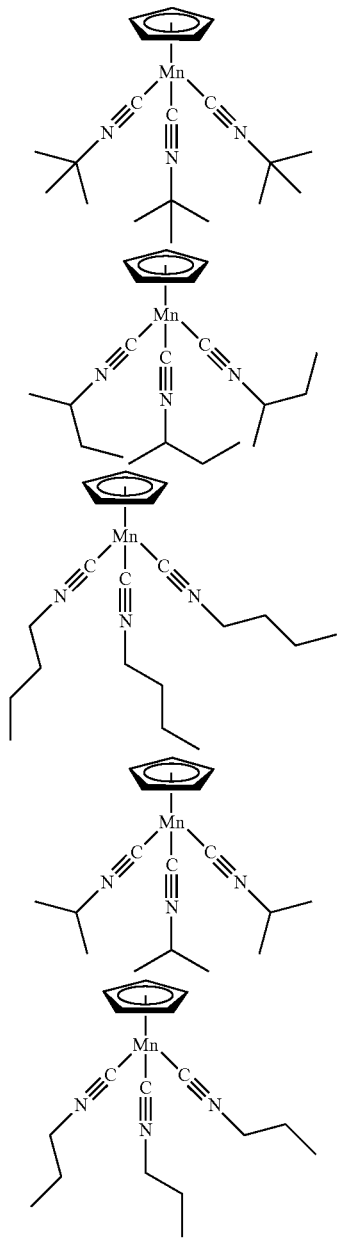

[Chemical Formula 5]

Compounds having substituent $R_1$ = methyl group and substituents $R_2$ to $R_5$ = hydrogen in L1

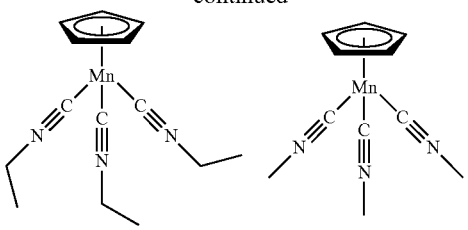
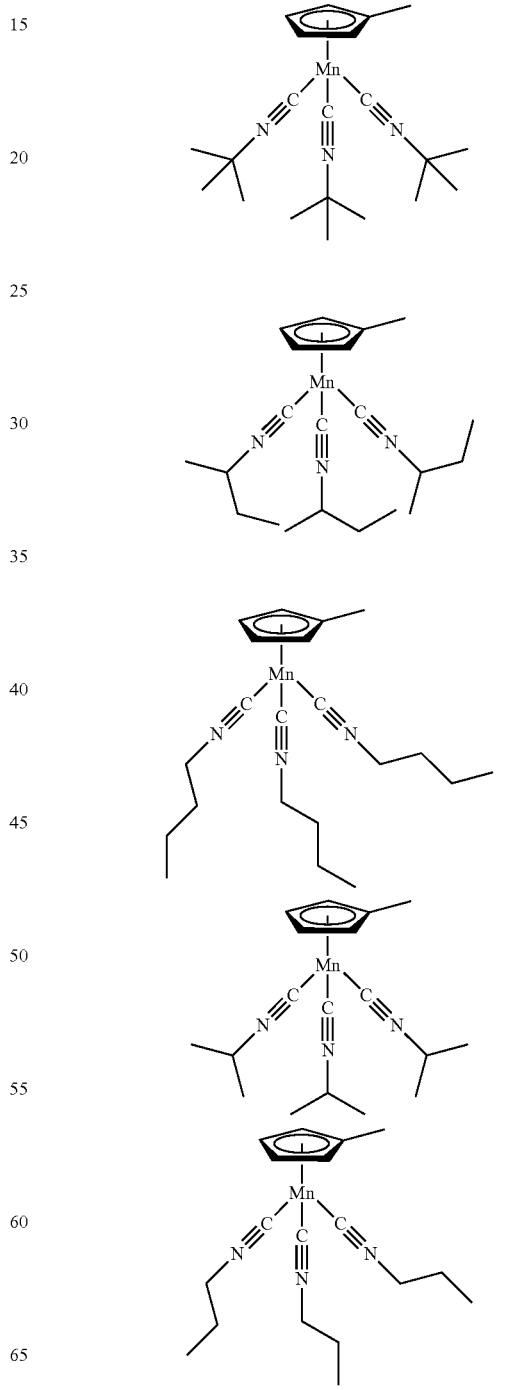

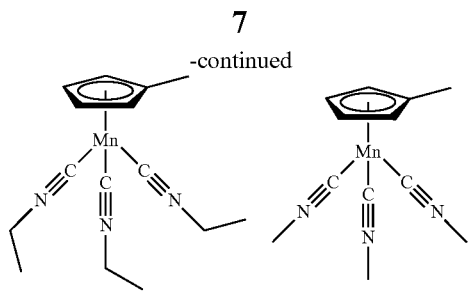
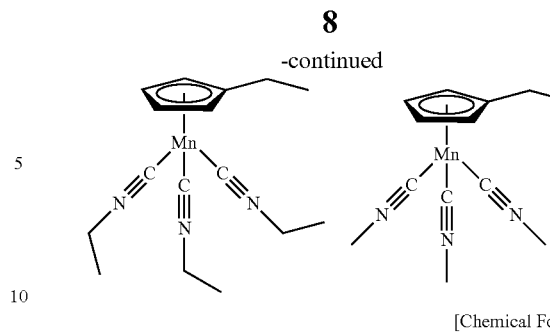
[Chemical Formula 6]
Compound having substituent $R_1$ = ethyl group and substituents $R_2$ to $R_5$ = hydrogen in L1
[Chemical Formula 7]
Compounds having substituent $R_1$ = n-propyl group and substituents $R_2$ to $R_5$ = hydrogen in L1
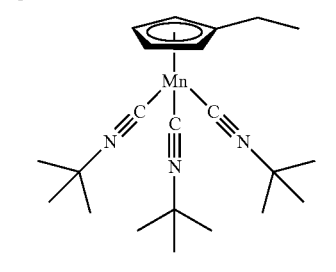
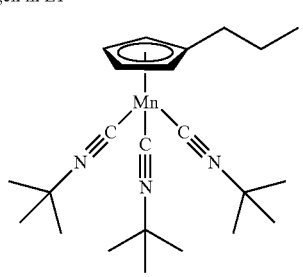
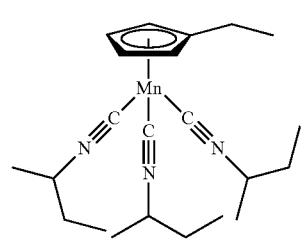
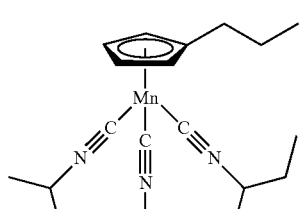
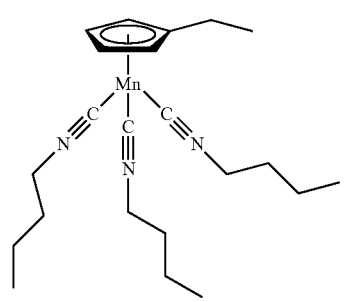
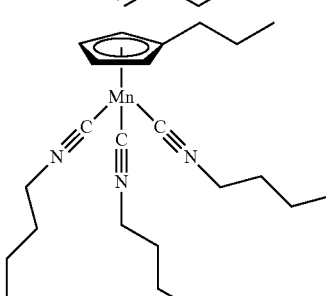
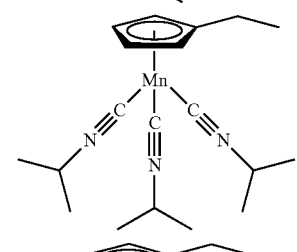
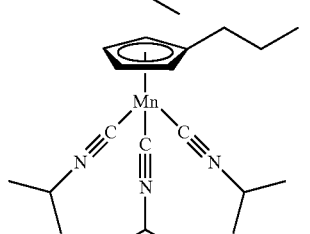
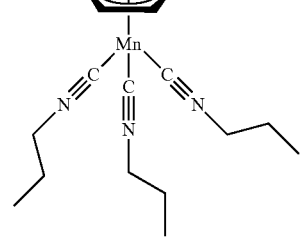
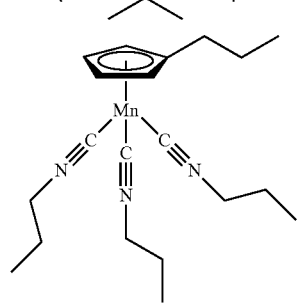

-continued
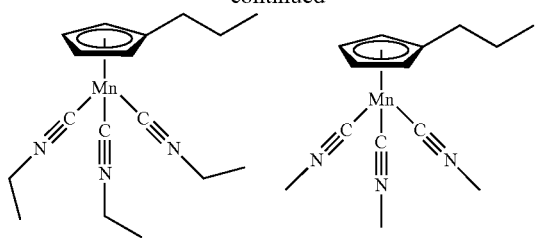
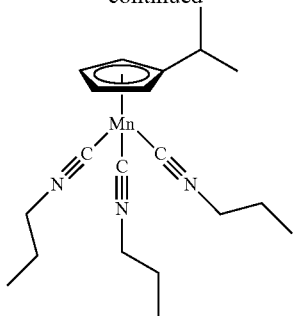
[Chemical Formula 8]
Compound having substituent $R_1$ = iso-propyl group and substituents $R_2$ to $R_5$ = hydrogen in L1
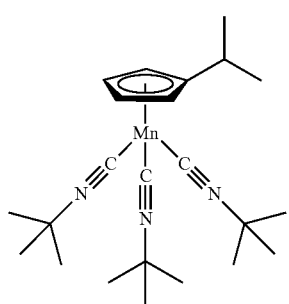
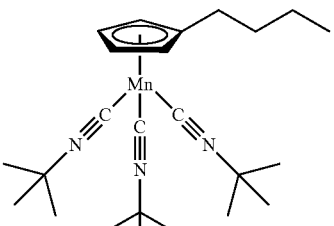
[Chemical Formula 9]
Compounds having substituent $R_1$ = n-butyl group and substituents $R_2$ to $R_5$ = hydrogen in L1
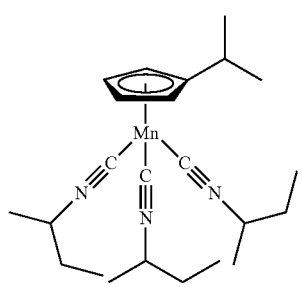
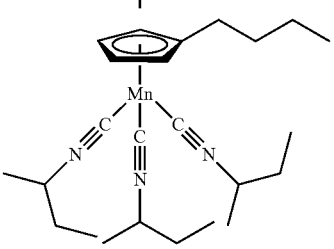
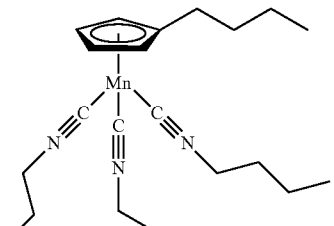
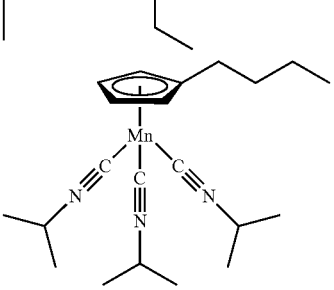

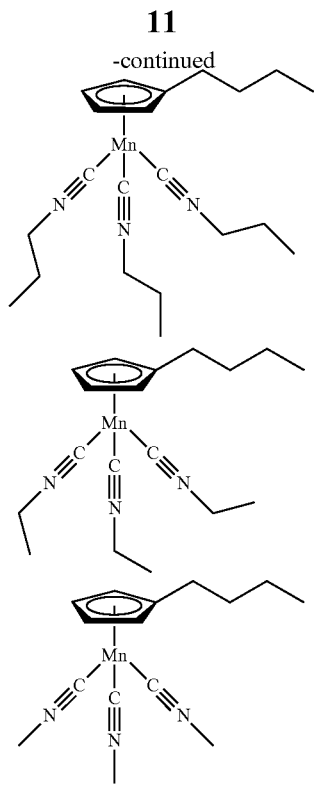
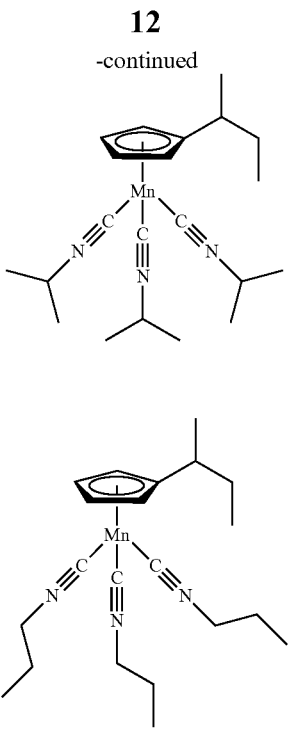
[Chemical Formula 10]
Compound having substituent $R_1$ = sec-butyl group and substituents $R_2$ to $R_5$ = hydrogen in L1
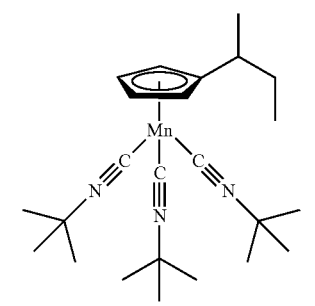
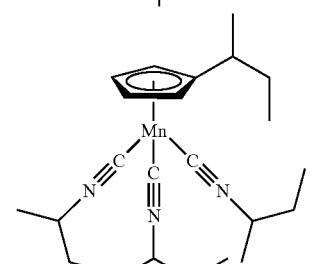
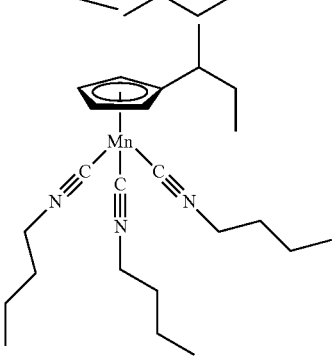
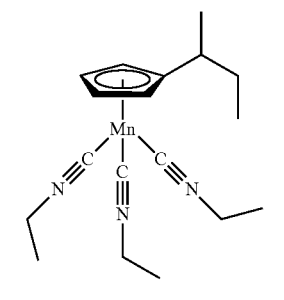
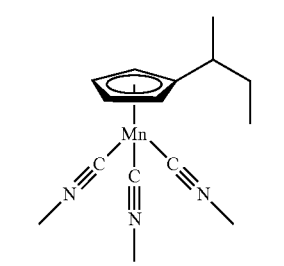
[Chemical Formula 11]
Compounds having substituent $R_1$ = tert-butyl group and substituents $R_2$ to $R_5$ = hydrogen in L1
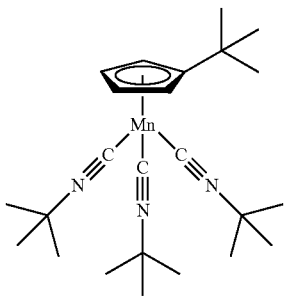

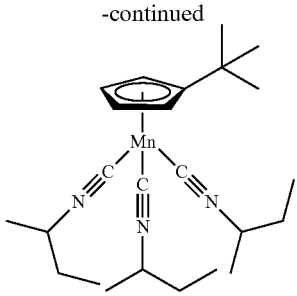

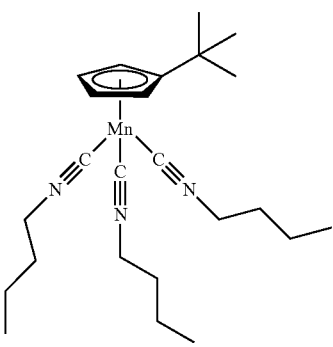

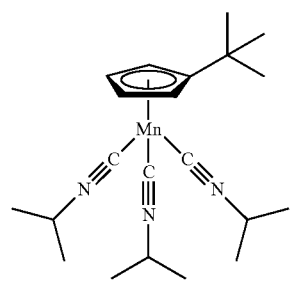

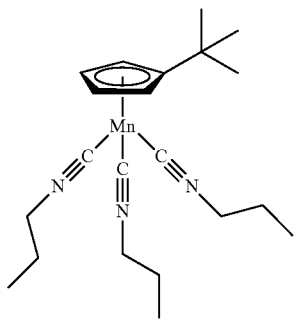

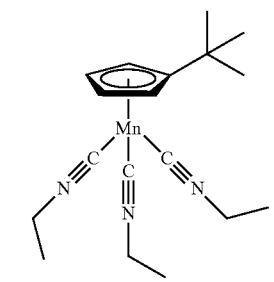

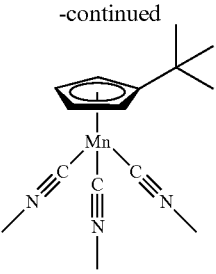

The organomanganese compound constituting the raw material for chemical deposition of the present invention can be produced from a raw material of metallocene of manganese (manganocene: Mn(L1)$_2$) having a cyclopentadienyl ligand, which is the same as the cyclopentadienyl ligand (L1) of the compound to be produced. The organomanganese compound of the present invention is synthesized through a reaction of the manganocene with a stoichiometric amount of isocyanide (L2) which is the same as the isocyanide (L2) of the compound to be produced.

The organomanganese compound constituting the raw material for chemical deposition of the present invention is a monovalent manganese complex (organic compound). A synthesis reaction for the compound is a reaction in which a monovalent manganese complex is synthesized from manganocene, a bivalent manganese complex. In this synthesis reaction, however, there is no need to use an additive such as a catalyst or a reducing agent in the reaction system. In other words, the synthesis reaction can be proceeded in the reaction system including only manganocene and an equivalent amount of isocyanide. As a specific method, the synthesis reaction proceeds by mixing manganocene and an equivalent amount of isocyanide with a solvent used if necessary. The synthesis reaction proceeds at normal temperature. When a solvent is used, the solvent is preferably ether (such as diethyl ether), tetrahydrofuran or alkane (such as n-hexane or n-pentane).

Next, a chemical deposition method of a manganese thin film or a manganese compound thin film in which the raw material for chemical deposition of the present invention is applied will be described. In the chemical deposition method of the present invention, the raw material comprising the organomanganese compound described so far is vaporized by heating to generate a raw material gas, and the raw material gas is transported onto a substrate surface, where the organomanganese compound is thermally decomposed to form a manganese thin film.

With respect to a form of the raw material used in the chemical deposition method, the organomanganese compound applied in the present invention is in a solid state or a liquid state at normal temperature depending on the substituents used therein. The raw material for chemical deposition including the organomanganese compound of the present invention can be easily vaporized by a distillation or sublimation method. Accordingly, the organomanganese compound corresponding to the raw material can be directly heated for use. Alternatively, the compound may be dissolved in an appropriate solvent to obtain a solution, and the solution may be heated to obtain a raw material gas. A heating temperature in vaporizing the raw material is preferably 50° C. or more and 120° C. or less.

The vaporized raw material is joined with an appropriate carrier gas to be transported onto a substrate. The organomanganese compound of the present invention enables manganese film formation only by heating without using a reaction gas with an inert gas (such as argon or nitrogen) used as a carrier gas. Since the organomanganese compound of the present invention does not contain oxygen in the structure, an oxide is difficult to be generated even when the compound is decomposed by heating, and hence a manganese thin film can be formed only by heating.

In order to efficiently form a manganese thin film, however, a reaction gas needs to be applied. Therefore, the raw material gas described above is preferably transported onto the substrate together with a reaction gas. When the raw material gas is heated together with the reaction gas on a substrate surface, a manganese thin film is formed. In the manganese film formation using the raw material for chemical deposition of the present invention, a reducing gas such as hydrogen can be used as the reaction gas. As the reaction gas, not only hydrogen but also a reducing gas such as ammonia, hydrazine or formic acid can be applied. Such a reaction gas can work also as a carrier gas, and hence the application of the carrier gas of an inert gas or the like described above is not essential.

The decomposition reaction itself of the organomanganese compound of the present invention can be proceeded with oxygen used as the reaction gas. Besides, there is no reason to forbid the organomanganese compound of the present invention from generating a manganese oxide. Accordingly, if it is demanded to produce a manganese compound thin film of manganese oxide or the like from the raw material for chemical deposition of the present invention, an oxygen gas can be applied as the reaction gas. In the fields of semiconductor devices and the like, a manganese oxide thin film is applied in some cases. The raw material for chemical deposition of the present invention can respond to such a demand.

A film forming temperature employed in the film formation is preferably 150° C. or more and 400° C. or less. When the temperature is less than 150° C., the decomposition reaction of the organomanganese compound is difficult to proceed, and hence a film cannot be efficiently formed. On the other hand, when the film forming temperature is a high temperature beyond 400° C., a uniform film is difficult to form, and there arises a problem that a substrate may be damaged. The film forming temperature is usually adjusted in accordance with a heating temperature for the substrate. The film forming temperature is more preferably 200° C. or more and 400° C. or less, and still more preferably 200° C. or more and 300° C. or less.

Advantageous Effects of Invention

As described above, an organomanganese compound constituting a raw material for chemical deposition of the present invention is improved in reactivity with substances such as hydrogen due to optimization of ligands coordinated to manganese. Therefore, a manganese thin film can be formed with a reducing gas such as hydrogen used as a reaction gas. According to the present invention, substrate oxidation and oxygen incorporation into a thin film can be well inhibited. Thus, a high-quality manganese thin film having very small oxygen and oxide contents can be formed.

The organomanganese compound of the present invention is also good in a vaporization characteristic and a decomposition characteristic conventionally required in a raw material for chemical deposition. Accordingly, the raw material for chemical deposition of the present invention is useful for forming a barrier layer or a seed layer of a semiconductor device highly miniaturized in recent years.

DESCRIPTION OF EMBODIMENTS

Figure 1:
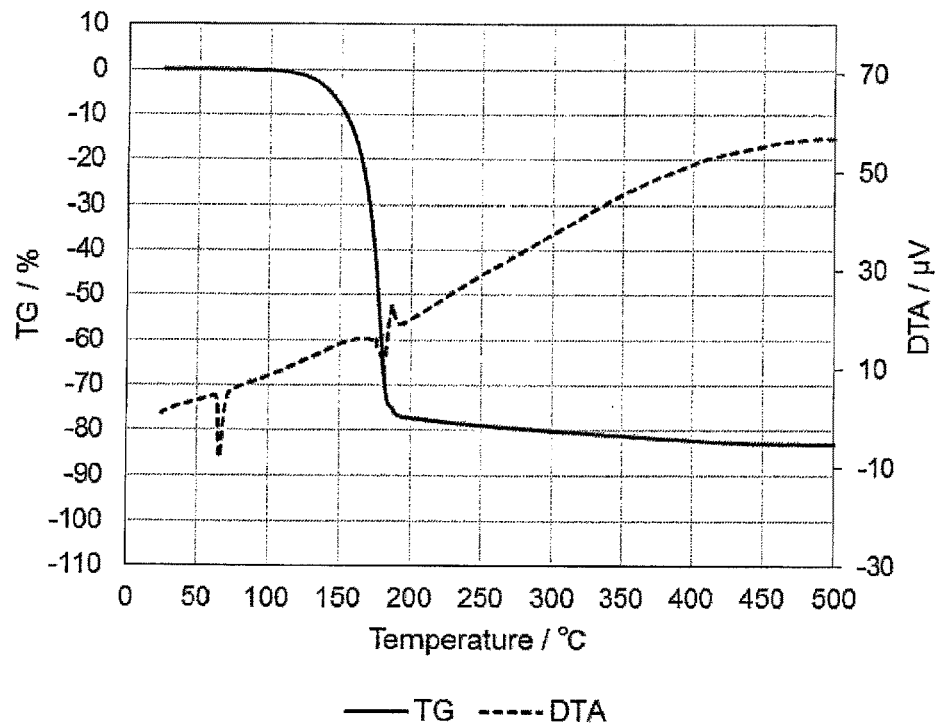
FIG. 1 illustrates a TG-DTA curve of an organomanganese compound according to Example 1 of First Embodiment.
Figure 2:
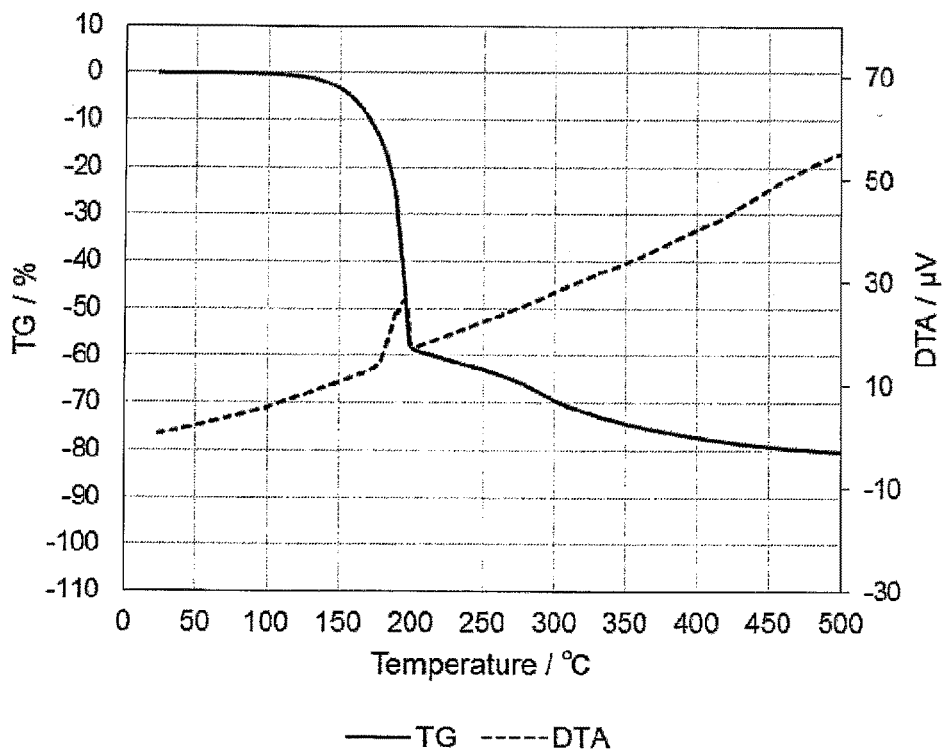
FIG. 2 illustrates a TG-DTA curve of an organomanganese compound according to Example 2 of First Embodiment.
Figure 3:
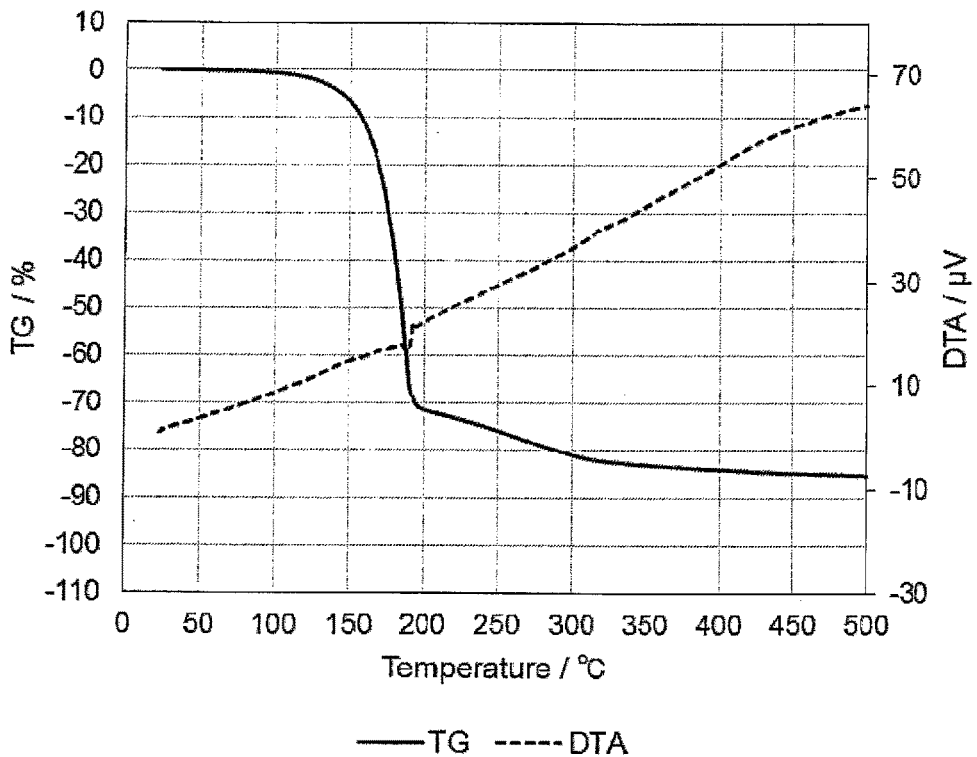
FIG. 3 illustrates a TG-DTA curve of an organomanganese compound according to Example 3 of First Embodiment.
Figure 4:
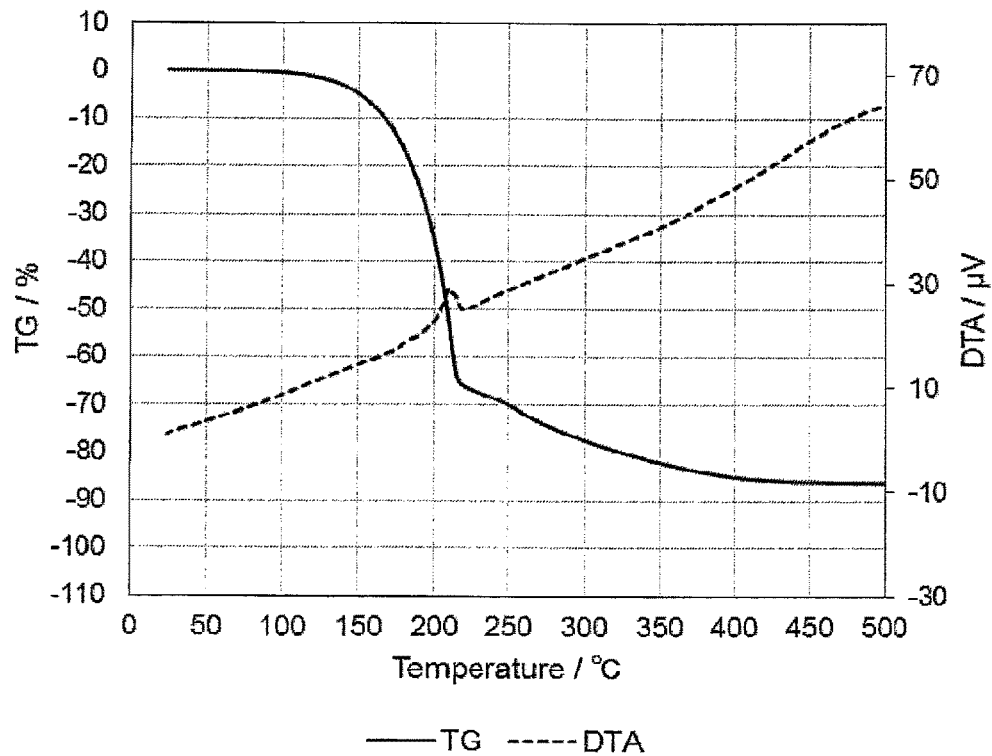
FIG. 4 illustrates a TG-DTA curve of an organomanganese compound according to Example 4 of First Embodiment.

First Embodiment: A best embodiment of the present invention will now be described. In this embodiment, four organomanganese compounds, in which substituents $R_1$ to $R_5$ of a cyclopentadienyl ligand (L1) were all hydrogen, or with only one of these set to an ethyl group, and a substituent $R_6$ of an isocyanide ligand (L2) was set to an iso-propyl group or a tert-butyl group, were synthesized, and decomposition characteristics of these compounds were evaluated, and it was examined whether or not a manganese film could be formed with a hydrogen gas.

Example 1: Synthesis of ($\eta^5$-cyclopentadienyl)-tris (2-isocyano-2-methylpropane)manganese To 10 mL of a diethyl ether solution of 0.185 g (1.0 mmol) of bis($\eta^5$-cyclopentadienyl)manganese, 10 mL of a diethyl ether solution of 0.263 g (3.0 mmol) of 2-isocyano-2-methylpropane was added, followed by stirring at 25° C. for 30 minutes.

Thereafter, the solvent was distilled off under reduced pressure, and was subjected to purification with a silica gel column containing n-hexane/diethyl ether (v/v, 15:1) as a developing solvent. The solvent of the resultant solution was distilled off under reduced pressure to obtain 0.28 g (0.76 mmol) of a target product of ($\eta^5$-cyclopentadienyl)-tris(2-isocyano-2-methylpropane)manganese (wherein $R_1$ to $R_5$ were hydrogen, and $R_6$ was a tert-butyl group) in the form of an orange yellow solid (yield: 76%). The reaction formula in this example is as follows:

[Chemical Formula 12]

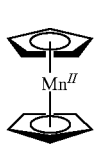 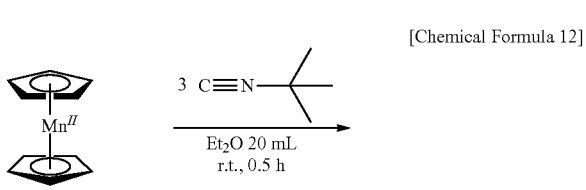

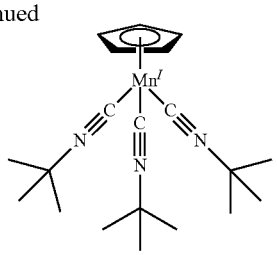

Example 2: Synthesis of ($\eta^5$-cyclopentadienyl)-tris (2-isocyanopropane)manganese To 10 mL of a diethyl ether solution of 0.185 g (1.0 mmol) of bis($\eta^5$-cyclopentadienyl)manganese, 10 mL of a diethyl ether solution of 0.207 g (3.0 mmol) of 2-isocyanopropane was added, followed by stirring at 25° C. for 30 minutes.

Thereafter, the solvent was distilled off under reduced pressure, and purification was conducted with a silica gel column containing n-hexane/diethyl ether (v/v, 15:1) as a developing solvent. The solvent of the resultant solution was distilled off under reduced pressure to obtain 0.18 g (0.55 mmol) of a target product of ($\eta^5$-cyclopentadienyl)-tris(2-isocyanopropane)manganese (wherein $R_1$ to $R_5$ were hydrogen, and $R_6$ was an iso-propyl group) in the form of an orange yellow liquid (yield: 55%). The reaction formula in this example is as follows:

[Chemical Formula 13]

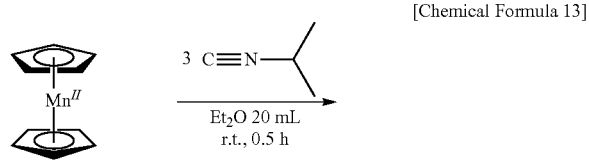

Example 3: Synthesis of ($\eta^5$-1-ethylcyclopentadienyl)-tris(2-isocyano-2-methylpropane)manganese To 70 mL of a diethyl ether solution of 7.24 g (30.0 mmol) of bis($\eta^5$-1-ethylcyclopentadienyl)manganese, 30 mL of a diethyl ether solution of 7.48 g (90.0 mmol) of 2-isocyano-2-methylpropane was added, followed by stirring at 25° C. for 30 minutes.

Thereafter, the solvent was distilled off under reduced pressure, and was subjected to purification with a silica gel column containing n-hexane/diethyl ether (v/v, 15:1) as a developing solvent. The solvent of the resultant solution was distilled off under reduced pressure to obtain 10.8 g (29.2 mmol) of a target product of ($\eta^5$-1-ethylcyclopentadienyl)-tris(2-isocyano-2-methylpropane)manganese (wherein $R_1$ was an ethyl group, $R_2$ to $R_5$ were hydrogen, and $R_6$ was a tert-butyl group) in the form of an orange yellow liquid (yield: 97%). The reaction formula in this example is as follows:

[Chemical Formula 14]

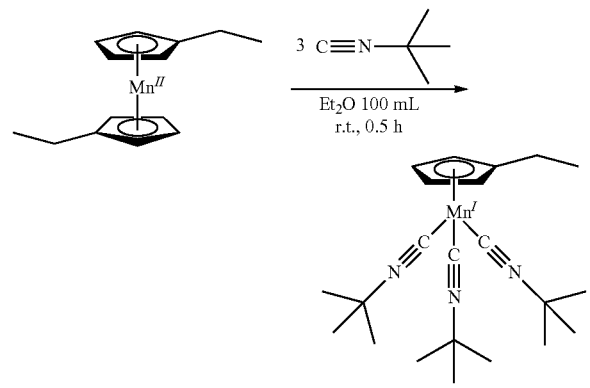

Example 4: Synthesis of ($\eta^5$-1-ethylcyclopentadienyl)-tris(2-isocyanopropane)manganese To 10 mL of a diethyl ether solution of 0.241 g (1.0 mmol) of bis($\eta^5$-1-ethylcyclopentadienyl)manganese, 10 mL of a diethyl ether solution of 0.207 g (3.0 mmol) of 2-isocyanopropane was added, followed by stirring at 25° C. for 30 minutes.

Thereafter, the solvent was distilled off under reduced pressure, and was subjected to purification with a silica gel column containing n-hexane/diethyl ether (v/v, 15:1) as a developing solvent. The solvent of the resultant solution was distilled off under reduced pressure to obtain 0.19 g (0.54 mmol) of a target product of ($\eta^5$-1-ethylcyclopentadienyl)-tris(2-isocyanopropane)manganese (wherein $R_1$ was an ethyl group, $R_2$ to $R_5$ were hydrogen, and $R_6$ was an iso-propyl group) in the form of an orange yellow liquid (yield: 54%). The reaction formula in this example is as follows:

[Chemical Formula 15]

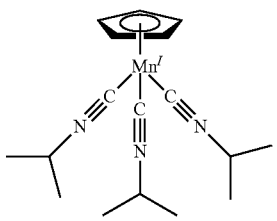

Examination of Vaporization Characteristic and Decomposition Characteristic: Each of the organomanganese compounds produced in the above-described examples was subjected to thermogravimetry-differential thermal analysis (TG-DTA) for examining the vaporization characteristic and the decomposition characteristic. In TG-DTA, TG-DTA2000SA manufactured by BRUKER was used, an aluminum cell was filled with a sample having a weight of 10 mg, and calorie change and weight change were observed at a temperature increasing rate of 5° C./min in a measurement temperature range of room temperature to 500° C. in a nitrogen atmosphere (under atmospheric pressure). FIGS. 1 to 4 illustrate TG-DTA curves of the organomanganese compounds of the respective examples.

Based on FIGS. 1 to 4, in the DTA curves of the organomanganese compounds of Examples 1 to 4 produced in the present embodiment, an endothermic peak or an exothermic peak derived from decomposition of the compound is observed in the vicinity of 200° C. It is noted that an endothermic peak in the vicinity of 65° C. of Example 1 is presumed to be derived from melting of the solid compound. Decomposition temperatures of the organomanganese compounds of Examples 1 to 4 were 187° C. (Example 1), 195° C. (Example 2), 187° C. (Example 3) and 209° C. (Example 4).

It was confirmed, according to the TG curves illustrated in FIGS. 1 to 4, that the decomposition of the organomanganese compounds of the respective examples smoothly proceed after the decomposition starts. As a residue generated after the decomposition, about 15% by mass of metal manganese was generated. Based on this examination on measurement results of the decomposition temperature obtained by TG-DTA and mass change caused after the decomposition, it was confirmed that the organomanganese compounds produced in the present embodiment can be decomposed at a temperature in the vicinity of 200° C., and that manganese can be smoothly precipitated after the decomposition.

Film Formation Test: The organomanganese compound of Example 3 produced in the present embodiment (($\eta^5$-1-ethylcyclopentadienyl)-tris(2-isocyano-2-methylpropane)manganese) was used as a raw material to form a manganese thin film with a CVD apparatus (hot wall CVD apparatus). A film formation test was conducted with the following film formation conditions:

Substrate: Si or $SiO_2$
Film forming temperature: 200° C. or 300° C.
Sample temperature (vaporization temperature): 80° C.
Carrier gas: nitrogen (50 sccm)
Reaction gas: none (0 sccm) or hydrogen (50 sccm)
Chamber pressure: 5 torr, 15 torr or 50 torr
Film forming time: 15 min In this film formation test, tris(2,2,6,6-tetramethyl-3,5-heptadionate)manganese, that is, a conventional organomanganese compound for chemical deposition, was also subjected to the film formation test as a comparative example. This organomanganese compound was synthesized by mixing a commercially available reagent, manganese (II) nitrate, with a 50% ethanol aqueous solution of 2,2,6,6-tetramethyl-3,5-heptadione, and adjusting pH of the resultant with a sodium hydroxide aqueous solution. The conditions for the film formation test were the same as those described above, and a hydrogen gas was used as the reaction gas.

After the film formation test, the thickness of the manganese thin film was measured in a plurality of positions by observation with an SEM (scanning electron microscope) or XRF (X-ray reflection fluorescence method) to calculate an average of the measured thicknesses. Results of the film formation test are shown in Table 1.

TABLE 1

| Test No. | Raw Material | Substrate | Film Forming Temperature | Film Forming Pressure | Reaction Gas*1 | Mn Thickness |
|---|---|---|---|---|---|---|
| 1 | Example | Si | 200° C. | 5 torr | 50 sccm | 9.8 nm |
| 2 | 3 | $SiO_2$ | | | | 8.0 nm |
| 3 | | | | 50 torr | | 50.0 nm |
| 4 | | Si | 300° C. | 15 torr | 0 sccm*2 | 42.1 nm |
| 5 | | $SiO_2$ | | | | 39.6 nm |
| 6 | Comparative | Si | 200° C. | 5 torr | 50 sccm | —*3 |
| 7 | Example | | 300° C. | 15 torr | 0 sccm | —*3 |

*1 The reaction gas was hydrogen.
*2 Film formation was performed only by heating in a carrier gas ($N_2$) atmosphere.
*3 Manganese film formation was not conducted.

As shown in Table 1, it was confirmed that a manganese thin film can be formed from a raw material comprising the organomanganese compound of Example 3 of the present embodiment (($\eta^5$-1-ethylcyclopentadienyl)-tris(2-isocyano-2-methylpropane)manganese). The organomanganese compound of the present embodiment can form a manganese film with a hydrogen gas used as a reaction gas. Besides, it was also confirmed that a manganese thin film can be formed only by heating without using a hydrogen gas (reaction gas).

The manganese thin films formed in the present embodiment were examined for the purity by XPS (X-ray photoelectron spectroscopy). In XPS, the formed manganese thin film was being etched, and in parallel, atomic concentrations in a thickness direction of various elements (Mn, 0, C, N and Si) were measured. The thin film was etched in consideration that the surface of the manganese thin film might be oxidized during transfer of the substrate from the CVD apparatus to an XPS analyzer.

Figure 5:
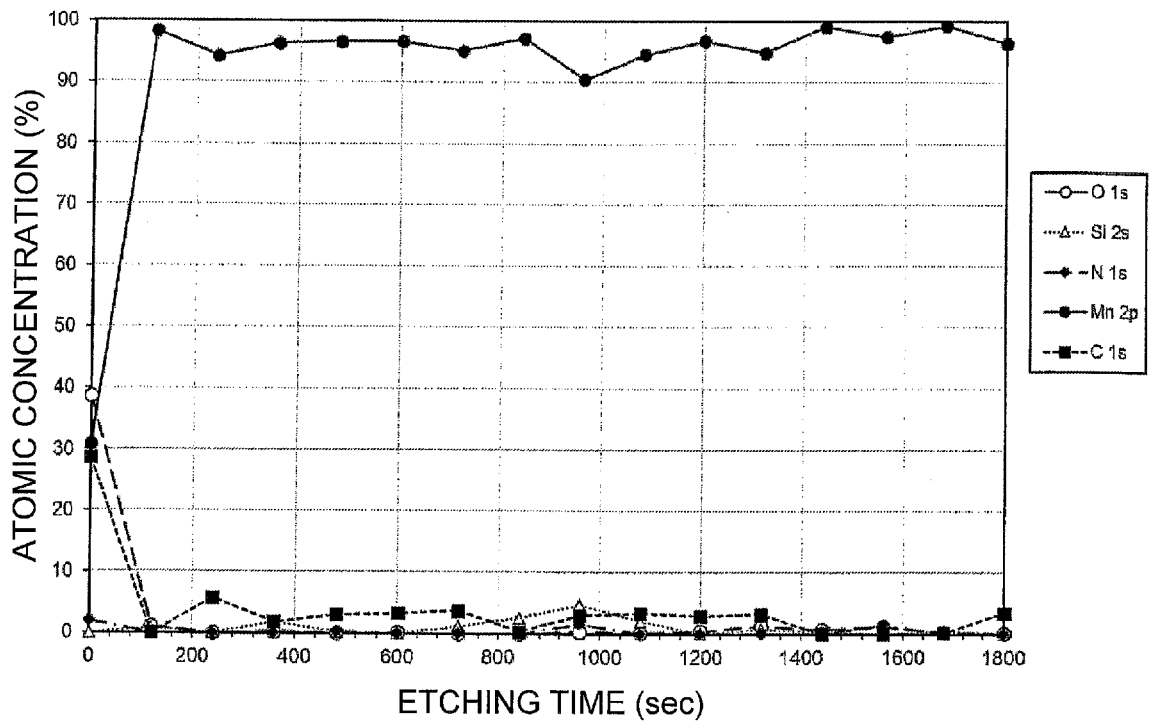
FIG. 5 is a diagram illustrating an analysis result, obtained through XPS, of a manganese thin film (No. 5) formed in First Embodiment.
Figure 6:
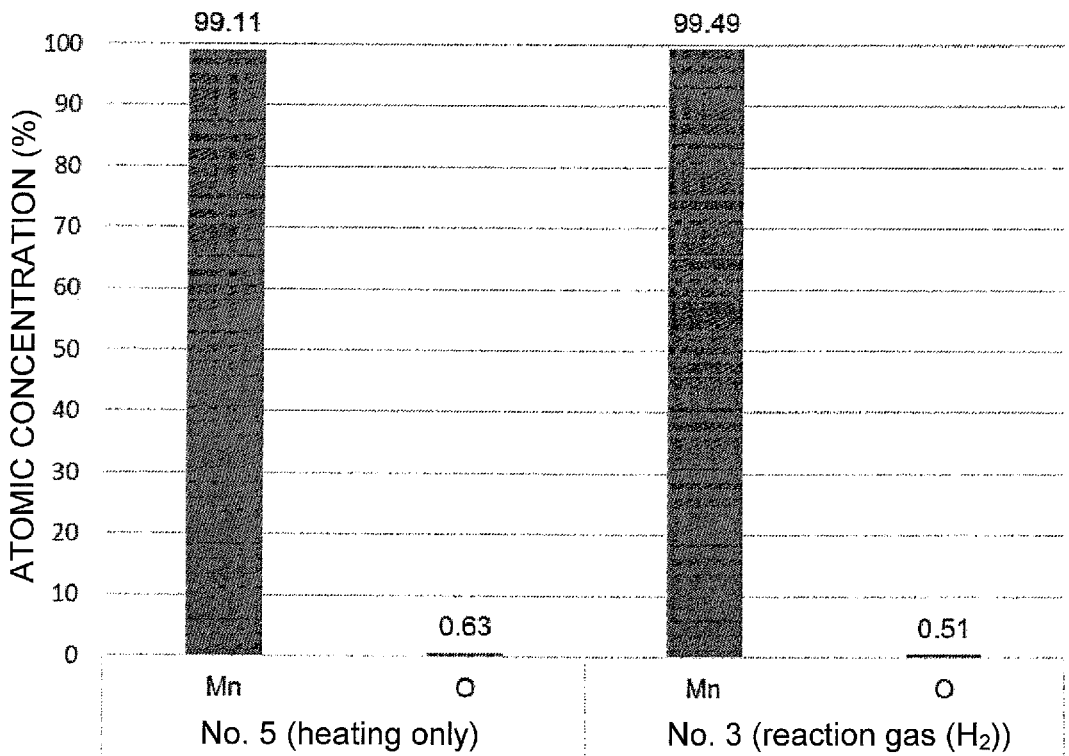
FIG. 6 is a diagram illustrating manganese atomic concentrations and oxygen atomic concentrations obtained through XPS of manganese thin films (No. 3 and No. 5) formed in First Embodiment.

As an example of analysis results obtained by XPS, the analysis result of a manganese thin film No. 5 shown in Table 1 is illustrated in FIG. 5. As is understood from FIG. 5, the manganese thin film No. 5 is oxidized in a top surface portion thereof, but contains pure manganese inside the thin film. FIG. 6 is a graph of comparing a manganese concentration (atomic concentration) and an oxygen concentration (atomic concentration) within each thin film obtained by XPS of the manganese thin films No. 3 and No. 5 of Table 1 after conducting etching for 1500 seconds. It is understood also from FIG. 6 that these manganese thin films contain pure manganese. Such an analysis result was similarly obtained in the other manganese thin films. Based on the results of XPS, it was confirmed that a pure manganese thin film can be formed from the organomanganese compound of the present invention. Besides, it was confirmed that the film formation of a pure manganese thin film can be conducted in either of a case where the film is formed with hydrogen used as a reaction gas (No. 3) and a case where the film is formed only by heating without using a reaction gas (No. 5).

As compared with the result of the organomanganese compound of the present embodiment, a manganese thin film could not be formed with a hydrogen gas in using the raw material of the conventional organomanganese compound (tris(2,2,6,6-tetramethyl-3,5-heptadionate)manganese) of the comparative example. The film formation could not be conducted only by heating in a nitrogen gas. Through comparison with this comparative example, the effect of the organomanganese compound of the present embodiment enabling film formation with a hydrogen gas is more clarified.

Second Embodiment: In this embodiment, a plurality of organomanganese compounds, in which substituents $R_1$ to $R_5$ of a cyclopentadienyl ligand (L1) were set to hydrogen, methyl, n-butyl or tert-butyl, and a substituent $R_6$ of an isocyanide ligand (L2) was set to iso-propyl or tert-butyl, were synthesized, and decomposition characteristics of these compounds were evaluated. In addition, a film formation test was conducted on some of the compounds.

In the same manner as in First Embodiment, diethyl ether was used as a solvent to produce a solution of manganocene having corresponding substituents, an isocyanide solution was added thereto, and the resultant was stirred at 25° C. for 30 minutes to synthesize an organomanganese compound. In the same manner as in First Embodiment, TG-DTA was conducted to measure a decomposition temperature of each compound. Results are shown in Table 2.

TABLE 2

| | Substituent $R_1$~$R_5$ | $R_6$ | Decomposition Temperature |
|---|---|---|---|
| Example 5 | $R_1$ = tert-butyl, $R_2 = R_3 = R_4 = R_5 = H$ | methyl | 190° C. |
| Example 6 | $R_1$ = tert-butyl, $R_2 = R_3 = R_4 = R_5 = H$ | iso-propyl | 213° C. |
| Example 7 | $R_1$ = n-butyl, $R_2 = R_3 = R_4 = R_5 = H$ | tert-butyl | 193° C. |
| Example 8 | $R_1$ = methyl, $R_2 = R_3 = R_4 = R_5 = H$ | iso-propyl | 197° C. |
| Example 9 | $R_1$ = methyl, $R_2 = R_3 = R_4 = R_5 = H$ | tert-butyl | 187° C. |
| Example 10 | $R_1 = R_3$ = methyl, $R_2 = R_4 = R_5 = H$ | methyl | 184° C. |
| Example 11 | $R_1 = R_3$ = methyl, $R_2 = R_4 = R_5 = H$ | tert-butyl | 189° C. |
| Example 12 | $R_1 = R_2 = R_3 = R_4 = R_5$ = methyl, | methyl | 193° C. |
| Example 13 | $R_1 = R_2 = R_3 = R_4 = R_5$ = methyl, | iso-propyl | 216° C. |

Based on Table 2, also organomanganese compounds of respective examples produced in the second embodiment could be decomposed at a temperature of 180° C. to 220° C. Besides, it was confirmed that manganese was smoothly precipitated after the decomposition to generate manganese as a residue.

Among these examples, the film formation test was conducted on the compounds of Example 9 and Example 11. The film formation conditions of the film formation test were the same as those of First Embodiment, and a film thickness (average) was measured based on SEM and XRF. As a result, it was confirmed that a high-purity manganese thin film can be formed also from the organomanganese compounds of this embodiment. The formed manganese thin films all had a sufficient thickness in a range of 10 to 40 nm.

INDUSTRIAL APPLICABILITY

An organomanganese compound constituting a raw material for chemical deposition of the present invention has high thermal stability, and enables formation of a manganese film with a reducing reaction gas such as hydrogen. Besides, the compound has a vaporization characteristic suitable as a raw material for chemical deposition. The present invention is useful for formation of a seed layer or a barrier layer of various semiconductor devices.

The invention claimed is:

1. A chemical deposition method of a manganese thin film or a manganese compound thin film, comprising vaporizing a raw material including an organomanganese compound to obtain a raw material gas, and introducing the raw material gas onto a substrate surface under heating,
wherein the raw material for chemical deposition comprising an organomanganese compound represented by the following Chemical Formula 1 in which a cyclopentadienyl ligand (L1) and three isocyanide ligands (L2) are coordinated to manganese is used as the raw material, and a reducing gas is used as a reaction gas

[Chemical Formula 1]

Mn(L1)(L2)$_3$

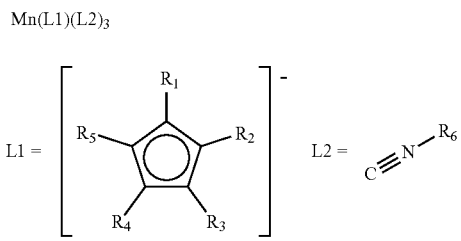

wherein substituents $R_1$ to $R_5$ of the cyclopentadienyl ligand (L1) each are hydrogen, or a linear, branched or cyclic alkyl group having a carbon number of 1 or more and 4 or less, and a substituent $R_6$ of the isocyanide ligand (L2) is a linear, branched or cyclic alkyl group having a carbon number of 1 or more and 4 or less.

2. The chemical deposition method according to claim 1, wherein the method comprises applying a hydrogen gas as the reaction gas, introducing the raw material gas together with the reaction gas onto the substrate surface, and heating the gases.

3. The chemical deposition method according to claim 2, wherein a film forming temperature is 150° C. or more and 400° C. or less.

4. The chemical deposition method according to claim 1, wherein a film forming temperature is 150° C. or more and 400° C. or less.

5. The chemical deposition method according to claim 1, wherein the substituents $R_1$ to $R_5$ of the cyclopentadienyl ligand (L1) are all hydrogen.

* * * * *